United States Patent
Tetsuka et al.

(10) Patent No.: US 10,796,884 B2
(45) Date of Patent: Oct. 6, 2020

(54) PLASMA PROCESSING APPARATUS

(71) Applicant: Hitachi High-Tech Corporation, Minato-ku, Tokyo (JP)

(72) Inventors: Tsutomu Tetsuka, Tokyo (JP); Makoto Satake, Tokyo (JP); Tadayoshi Kawaguchi, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 442 days.

(21) Appl. No.: 14/181,968

(22) Filed: Feb. 17, 2014

(65) Prior Publication Data
US 2015/0068681 A1    Mar. 12, 2015

(30) Foreign Application Priority Data

Sep. 6, 2013 (JP) .................................. 2013-185022

(51) Int. Cl.
*H01J 37/32* (2006.01)
*C23C 16/52* (2006.01)
*C23C 16/507* (2006.01)

(52) U.S. Cl.
CPC ...... *H01J 37/32137* (2013.01); *C23C 16/507* (2013.01); *C23C 16/52* (2013.01); *H01J 37/3211* (2013.01)

(58) Field of Classification Search
CPC ............... H01J 37/321; H01J 37/32119; H01J 37/32146; H01J 37/32155;
(Continued)

(56) References Cited

U.S. PATENT DOCUMENTS 5,261,962 A * 11/1993 Hamamoto ........... C23C 16/507
                                                     118/723 I
5,540,800 A *  7/1996 Qian .................... C23C 16/507
                                                     118/723 I
(Continued)

FOREIGN PATENT DOCUMENTS

JP    H07-122397 A    5/1995
JP    H08-115799 A    5/1996
(Continued)

OTHER PUBLICATIONS

Partial English Translation of Office Action dated Jan. 19, 2015, in Korean Patent Application No. 10-2014-12922.
(Continued)

*Primary Examiner* — Ram N Kackar
(74) *Attorney, Agent, or Firm* — Miles & Stockbridge, P.C.

(57) ABSTRACT

A plasma processing device includes a processing chamber for generating a plasma, a vacuum window that constitutes a part of a wall of the processing chamber, induction antennas including at least two systems for generating plasma in the processing chamber, radio frequency power sources for applying the current independently to the respective induction antennas, and a controller including phase circuits for controlling the phase of the current of the radio frequency power sources of the respective systems or the current value over time, and a control unit. The controller sequentially time modulates the phase difference between currents flowing to the systems or the current value within a sample processing period to move the plasma generation position so as to make the ion incident angle to the wafer uniform in the wafer plane.

15 Claims, 10 Drawing Sheets

(58) Field of Classification Search
CPC ........... H01J 37/32165; H01J 37/32174; H01J 37/32183; H01J 37/32137; H01J 37/3211; H01J 37/32128; H01J 37/32; C23C 16/52; C23C 16/507; H01L 21/205; H01L 21/265; H01L 21/3065; H05H 1/46
USPC ...... 118/723 I, 723 IR, 723 AN; 156/345.48, 156/345.49; 315/111.51
See application file for complete search history.

(56) References Cited

U.S. PATENT DOCUMENTS

| | | | | |
|---|---|---|---|---|
| 5,571,366 | A * | 11/1996 | Ishii | H01J 37/32082 118/723 I |
| 5,619,103 | A * | 4/1997 | Tobin | H01J 37/321 204/298.08 |
| 5,637,961 | A | 6/1997 | Ishii et al. | |
| 5,685,942 | A | 11/1997 | Ishii | |
| 5,897,713 | A * | 4/1999 | Tomioka | C23C 16/401 118/723 I |
| 7,223,321 | B1 * | 5/2007 | Comendant | H01J 37/321 118/723 AN |
| 2003/0062840 | A1 * | 4/2003 | Moroz | H01J 37/32091 315/111.51 |
| 2004/0045507 | A1 | 3/2004 | Okumura et al. | |
| 2004/0194890 | A1 * | 10/2004 | Moroz | H01J 37/321 156/345.48 |
| 2006/0175016 | A1 * | 8/2006 | Edamura | H01J 37/32091 156/345.48 |
| 2006/0225653 | A1 * | 10/2006 | Xu | H01J 37/321 118/723 E |
| 2007/0228009 | A1 * | 10/2007 | Yamazawa | H01J 37/32091 216/67 |
| 2008/0023139 | A1 | 1/2008 | Yasui et al. | |
| 2010/0175832 | A1 * | 7/2010 | Nishio | H01J 37/321 156/345.49 |
| 2012/0061022 | A1 * | 3/2012 | Park | H01J 37/3211 156/345.38 |

FOREIGN PATENT DOCUMENTS

| | | |
|---|---|---|
| JP | H08-227800 A | 9/1996 |
| JP | H09-082495 A | 3/1997 |
| JP | 2000-058296 A | 2/2000 |
| JP | 2004-047695 A | 2/2004 |
| JP | 2006-318725 A | 11/2006 |
| KR | 2008-0112619 A | 12/2008 |
| TW | 200807551 A | 2/2008 |
| TW | 201028051 A | 7/2010 |

OTHER PUBLICATIONS

Partial English translation of Office Action dated Nov. 4, 2014, in Taiwanese Patent Application No. 103100654.
Office Action dated Jun. 13, 2017 for related Japan Application No. 2013-185022.

* cited by examiner

CHANGE IN PHASE DIFFERENCE BETWEEN ANTENNA CURRENTS OVER TIME IN PHASE CIRCUIT

CHANGE IN PHASE DIFFERENCE PROPORTIONAL TO FREQUNCY DIFFERENCE OVER TIME

CHANGE IN CURRENTS OF ANTENNAS 1, 2 OVER TIME

PLASMA PROCESSING APPARATUS

CLAIM OF PRIORITY

The present application claims priority from Japanese patent application JP2013-185022 filed on Sep. 6, 2013, the content of which is hereby incorporated by reference into this application.

BACKGROUND OF THE INVENTION

The invention relates to a plasma processing device which performs surface processing, for example, substrate etching and thin film formation by means of plasma. More specifically, the invention relates to an inductive coupling plasma processing technology.

TECHNICAL FIELD

A plasma processing device has been widely employed for etching of fine elements and the thin film formation in the field of semiconductor device manufacturing. Especially, the plasma processing device of inductive coupling type has a relatively simple structure, configured to apply radio frequency currents to an induction coil provided outside the processing chamber to supply power to plasma through the induced current. The above-described approach, therefore, has been generally distributed.

The use of plasma provides advantages of accelerating the chemical reaction through-energy electrons, and allowing directional processing by irradiating the surface of the wafer to be processed with the high-energy ions. In such a case, uniform processing over an entire surface of the wafer to be processed needs the technique to control the density distribution of the plasma (electron, ion, reactant gas and the like).

JP-A-2000-058296 and JP-A-2006-318725 disclose the method of controlling the plasma density distribution. Specifically, multiple radio frequency antennas for plasma generation are provided so as to operate radio frequency power to be supplied to the radio frequency antennas or the phase independently. This may change the distribution of the electromagnetic field of radio frequency supplied to the plasma, which allows control of the plasma distribution.

BRIEF SUMMARY OF THE INVENTION

As disclosed in the related art, the reactant gas is excited and ionized in accordance with the plasma distribution. The reactive ion and radical are generated, having spatial distribution, and subjected to the chemical reaction on the wafer surface. The ion incident on the wafer is accelerated with high energy at the radio frequency voltage applied to the wafer, and radiated to the wafer in accordance with the plasma distribution. Accordingly, the plasma distribution is controlled so that the processing with the chemical reaction through radical and ion irradiation becomes uniform over the entire surface of the wafer.

Basically, however, the plasma generated above the wafer forms the density distribution while having the wall of the processing chamber serving as the boundary. The plasma distribution control as described above is insufficient to realize the uniform processing. It is therefore difficult to establish the uniform incident direction of the ion. The plasma distribution varies dependent on the processing conditions (gas type, working gas pressure, reaction products and the like). It will take time for optimizing the plasma distribution for each processing condition.

If uniformization of the plasma distribution is insufficient, the ion will be accelerated in the bipolar field (to be described later) at the plasma potential in accordance with the plasma distribution. The ion speed direction changes before it reaches the wafer. The density largely changes at the peripheral region of the plasma under the influence of the wall, and therefore, the bipolar field is intensified. The ion is incident on the wafer vertically at its center. As the ion approaches the outer peripheral position of the wafer, it is incident on the wafer at the inclined incident angle. In such a case, sputter proceeds in accordance with the ion direction to give an influence on the etching and shape of the generated film. This may change the processed configuration in the wafer plane.

The currently distributed wafer generally has its diameter of 20 cm or 30 cm. However, the size of the wafer with diameter of 45 cm is expected to be the mainstream. It is estimated to have more difficulty in establishment of the uniformity by regulating the plasma density and the ion incident direction to be uniform with increase in the wafer diameter.

The present invention provides the inductive coupling plasma processing device with multiple induction antennas, which is configured to uniformize the direction of the ion incident on the sample as the workpiece in the sample plane.

The present invention provides a plasma processing device which includes a processing chamber for plasma processing of a sample, a dielectric window for air-tightly sealing the processing chamber, a plurality of induction antennas provided outside the dielectric window for generating an induced magnetic field, a radio frequency power source for supplying radio frequency power to the induction antennas, and a controller for periodically changing a phase difference or a current value of a radio frequency current flowing to the induction antennas over time.

The plasma processing device according to the invention is configured to sequentially change the phase difference between the currents flowing to the radio frequency antennas of two or more systems, or the current value over time, and to sweep the radio frequency absorption region to the plasma. This may uniformize the incident angle of the ion incident on the wafer over the entire surface of the sample through time average.

DETAILED DESCRIPTION OF THE INVENTION

Figure 1:
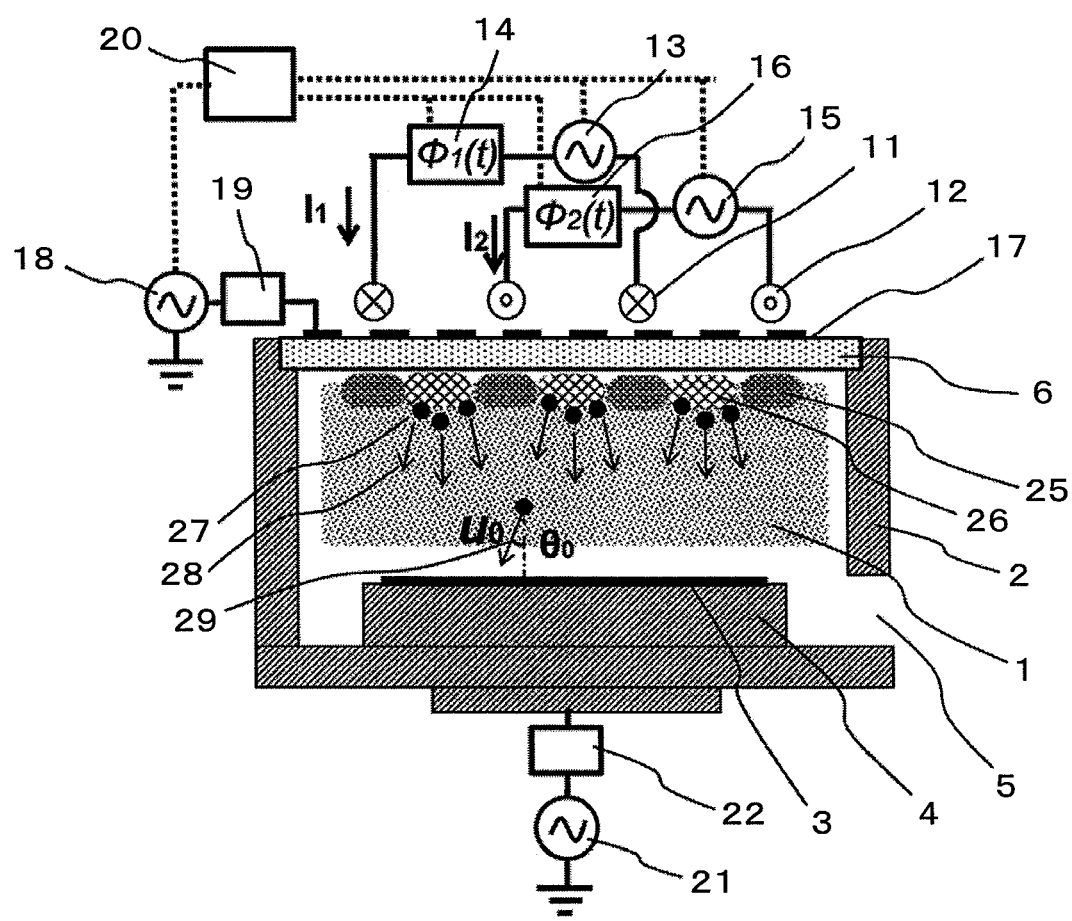
FIG. 1 is a sectional view schematically illustrating a plasma processing device according to a first example.

Examples of the plasma processing device according to the invention will be described referring to the drawings.

First Example

An explanation is made with respect to the plasma processing device as a first example, which include a processing chamber for performing plasma processing of the sample, a dielectric window for air-rightly sealing the processing chamber, multiple induction antennas provided outside the dielectric window for generating an induced magnetic field, a radio frequency power source for supplying radio frequency power to the induction antennas, and a controller for periodically changing the phase difference or current value of the radio frequency current flowing to the respective induction antennas over time.

FIG. 1 is a sectional view of an exemplary plasma processing device according to the first example. A processing chamber 2 which generates and confines a plasma 1 includes a vacuum window 6 at its upper part as a dielectric window composed of an insulation material such as quartz and alumina ceramic, a wafer support base 4 on which a sample wafer 3 as a workpiece is disposed, a gas supply unit (not shown) for supplying working gas, and an outlet 5 at the lower part for evacuation.

Multiple induction antennas as coil-shaped two-system radio frequency antennas 11 and 12 are provided outside the vacuum window 6. The two-system radio frequency antennas 11 and 12 are independently connected to radio frequency power sources 13 and 15, and phase circuits 14 and 16 which constitute a part of the controller that periodically changes the phase difference or current value of the radio frequency current over time for controlling each phase of radio frequency currents $I_1$ and $I_2$ flowing to the respective systems. The radio frequency power sources 13 and 15 for the respective systems, and the phase circuits 14 and 16 are operated by a control unit 20 which constitutes a part of the controller that periodically changes the phase difference or current value of the radio frequency current over time so as to control change in each current phase of the respective systems, and the waveform and cycle of the amperage over time, which will be described later.

A radio frequency power source 18 is connected between the vacuum window 6 and the radio frequency antennas 11, 12 via a matching unit 19. The potential of an electrode 17 is controlled to be in the range from 0 V to several thousands V by applying radio frequency ranging from 13.56 MHz to 100 MHz to the electrode 17 disposed on the upper surface of the vacuum window 6. The use of the electrode 17 prevents the radio frequency voltages of the radio frequency antennas 11 and 12 from being influential resulting from capacitive coupling with the plasma 1. For the purpose of cleaning the vacuum window 6, the plasma ion is accelerated towards the surface of the vacuum window 6 at the radio frequency voltage of the electrode 17 so that the stain on the surface is removed through sputter. An exemplary configuration of the electrodes 17 suitable for the plasma processing device according to this example will be described in detail as a third example.

A radio frequency power source 21 is connected to the wafer 3 as the workpiece via a matching unit 22. For example, radio frequency ranging from 400 kHz to several tens MHz is applied to the wafer 3 so as to be irradiated with the ion extracted from the plasma.

Outputs of the radio frequency power sources 18 and 21, which are applied to the electrodes 17 and the wafer 3 are operated in cooperation with the control unit 20 in accordance with the change in currents of the respective systems over time so as to optimize cleaning of the vacuum window 6 and processing characteristics of the wafer 3 in a comprehensive way.

radio-frequency power is applied to the radio frequency antennas 11 and 12. Electrons are heated by the induced current flowing onto the plasma surface so that the generated plasma is retained. The induced current on the plasma surface flows thereon in accordance with the intensity distribution of the magnetic field induced by the radio frequency antennas 11 and 12. It is therefore possible to change the intensity distribution of the induced magnetic field with phases of the radio frequency antennas 11 and 12. Assuming that the current flowing to the two-system radio frequency antennas 11 and 12 has the same phase, the magnetic fields generated by the respective antennas are mutually intensified, and the magnetic field intensity between those antennas is enhanced. The radio frequency absorption is strengthened in an absorption region 26. Meanwhile, assuming that a phase of the current flowing to the respective antennas is shifted from another phase at 180°, the magnetic fields are mutually cancelled at the center of the antenna. The magnetic field intensity is then enhanced just below the antenna so that the radio-frequency power is absorbed mainly in an absorption region 25. The plasma processing device according to the example is configured that the phase circuits 14, 16 and the control unit 20 which constitute the controller periodically change the phase difference or current value of the radio frequency current flowing to the adjacent radio frequency antennas 11 and 12 over time.

Figure 3A:
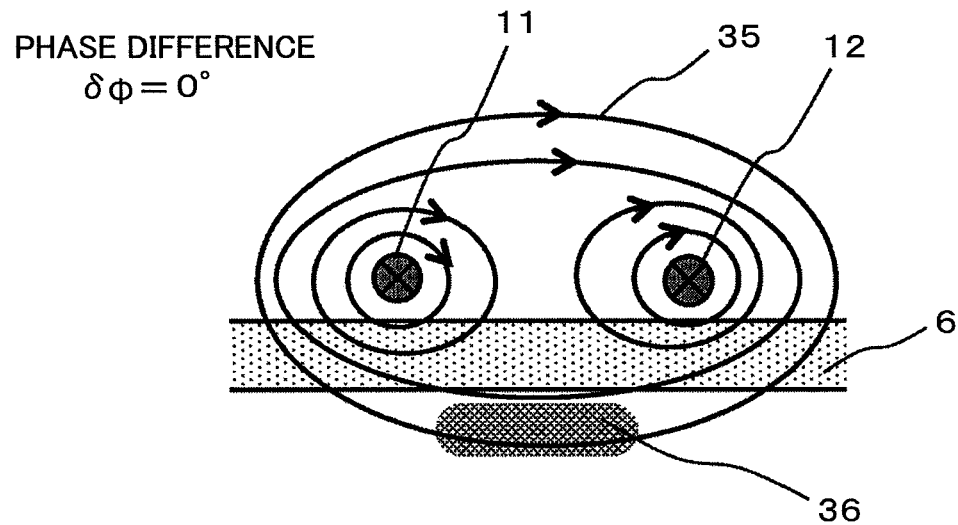
FIG. 3A is a schematic view illustrating an exemplary relationship between the phase of the radio frequency current supplied to the respective radio frequency antennas and the region where the plasma absorbs radio-frequency power.
Figure 3B:
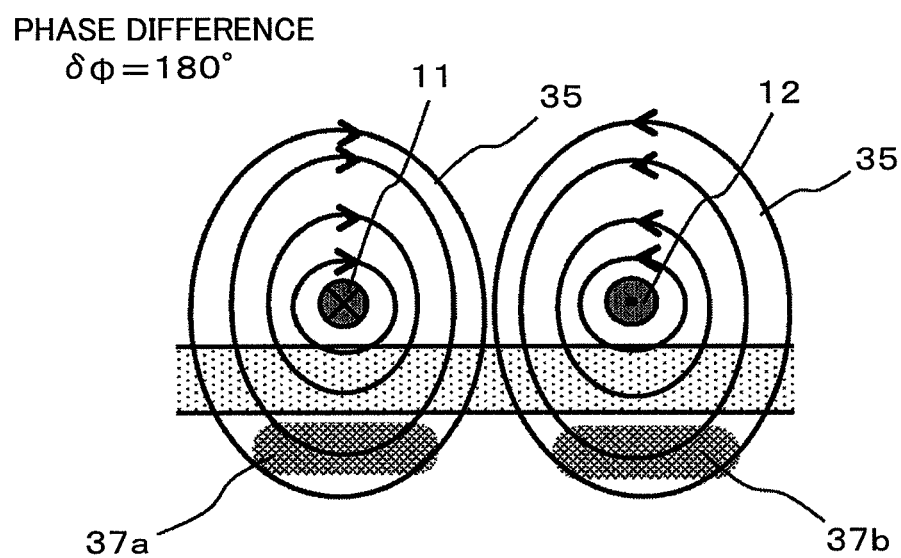
FIG. 3B is a schematic view illustrating another exemplary relationship between the phase of the radio frequency current supplied to the respective radio frequency antennas and the region where the plasma absorbs.

A relationship between the current flowing to the antennas and the magnetic field will be described referring to schematic views of FIGS. 3A and 3B. FIG. 3A illustrates that each phase of the currents flowing to the two-system antennas 11 and 12 is the same, and the phase difference is expressed by $\delta\phi=0°$. FIG. 3B illustrates the phase difference expressed by $\delta\phi=180°$.

In the case where $\delta\phi=0°$ as shown in FIG. 3A, each magnetic force line 35 of the respective antennas is in the same direction, and the magnetic force line near the plasma via the vacuum window 6 is maximized between those antennas. The induction current is strongly induced by the plasma, and the radio-frequency power is absorbed at the position in the radio frequency absorption region 36. In the case where $\delta\phi=180°$ as shown in FIG. 3B, the magnetic force lines of the respective antennas are inversely directed. The magnetic fields are then mutually canceled at the intermediate positions of the respective antennas, and the radio-frequency power is strongly absorbed in radio frequency absorption regions 37a and 37b just below the respective antennas. In this way, the phase difference of the current flowing between the antennas of the respective systems allows interference in the magnetic fields of the respective antennas to change the radio frequency absorption region. The actual interference pattern of the magnetic field depends on the shape and arrangement of the antennas and the vacuum window.

Referring to FIG. 1 illustrating the plasma processing device of inductive coupling plasma type, the induction current is strongly induced on the plasma surface at the depth of approximately 20 mm or less from the vacuum window 6. Electrons in the absorption region are heated, and the plasma is locally generated through ionization caused by collisions between neutral particles and electrons. The generated plasma diffuses to spread within the processing chamber 2. A generated ion 27 is accelerated in a bipolar field E in proportion to the plasma density gradient. It is accelerated to spread in a speed direction 28 at right angles to the contour of the density distribution.

The bipolar field E is expressed by the following expression 1:

$$E=-(kTe/e)\nabla n/n \quad (1)$$

where k denotes Boltzmann constant (1.3807E-23 J/K), e denotes an electron charge (1.6022E-19 C), Te denotes an electron temperature, and n denotes an electron density.

When the radio frequency absorption region moves in accordance with the phase difference of the current of the respective antennas, the direction where the ion is accelerated in accordance with change in the plasma density distribution, that is, the density gradient direction changes. As a result, the phase difference of each current of the respective antennas is changed over time to vary an inclination 29 of the ion as a sheath incident angle $\theta_0$ over time near the wafer. As for the change in the ion inclination 29 over time, the time average of the ion inclination 29 within the processing period may be made uniform over the entire surface of the wafer through adjustment of the arrangement of the antennas such as the interval, and the phase difference that changes over time under control of the controller.

Generally, the ion inclination 29 tends to become smaller towards the center of the wafer, and larger towards the outer periphery of the wafer in accordance with the overall plasma distribution. On the contrary, as the structure of the first example shown in FIG. 1 represents, the ion inclination 29 varies with the phase difference over the entire surface of the wafer as passage of time under the control of the controller. This makes it possible to perform the uniform processing, for example, etching and thin film formation without being influenced by directivity of the shape and film quality owing to the ion incident direction.

Figure 2:
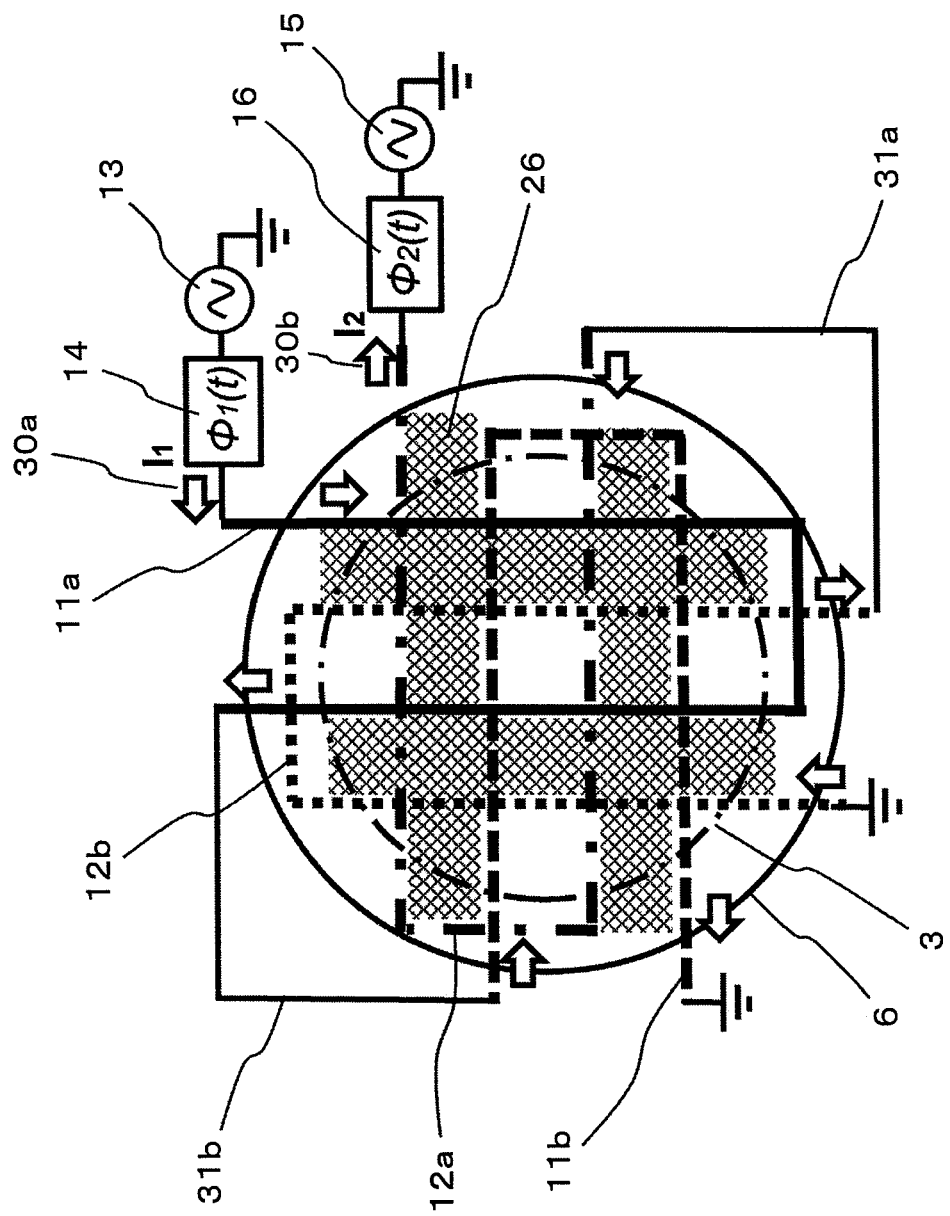
FIG. 2 is a schematic view illustrating a relationship between an exemplary configuration of the radio frequency antennas of the plasma processing device according to the first example and the position where the plasma absorbs radio-frequency power.

FIG. 2 illustrates a preferred exemplary configuration of the radio frequency antennas for the plasma processing device according to the example. Referring to FIG. 2, the adjacent frequency antennas 11 and 12 are provided by crossing two-system radio frequency antennas at right angles for the purpose of two-dimensionally changing the plasma distribution in the wafer plane. The intermediate connection between the antennas is performed using wirings 31a and 31b as conductor plates, for example. The adjacent two-system radio frequency antennas 11 and 12 are relatively closely arranged in parallel with each other for interference effect between the respective radio frequency antennas. Referring to the drawing, current $I_1$ flows to the antennas 11a and 11b, and current $I_2$ flows to antennas 12a and 12b, respectively.

Assuming that directions of the radio frequency currents from the radio frequency power sources 13 and 15 have phases as indicated by current directions 30a and 30b in the configuration of the antennas shown in FIG. 2, magnetic fields of the respective antennas on the plasma surface are intensified in the radio frequency absorption region 26. When the current phase between the antennas is operated with phase circuits 14 and 16 that constitute the controller, the radio frequency absorption region moves from the radio frequency absorption region 26 so that the position at which the plasma is strongly generated two-dimensionally moves in the plane just below the vacuum window 6 as passage of time.

Figure 4A:
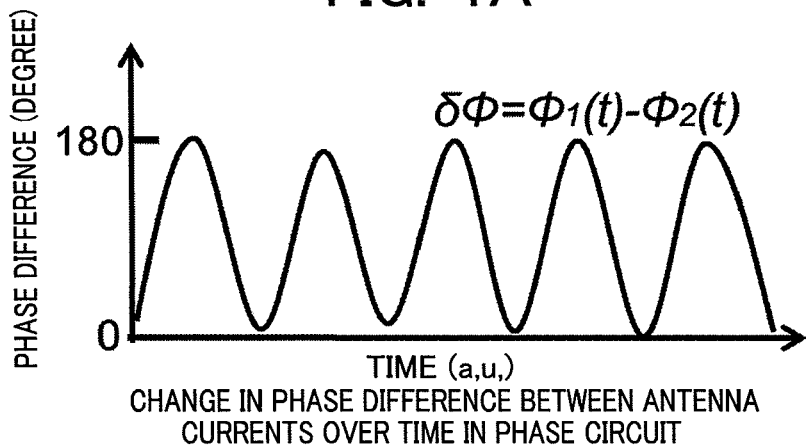
FIG. 4A is a schematic view illustrating change in a phase difference of the radio frequency current supplied to the radio frequency antennas of the respective systems over time according to the first example.
Figure 4B:
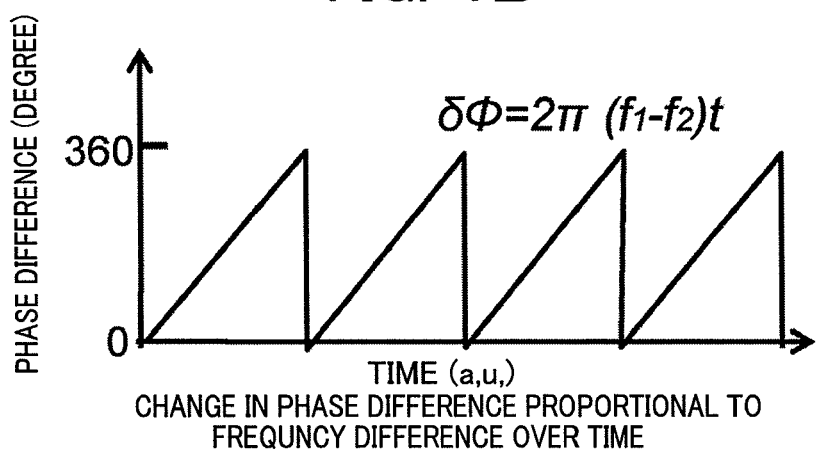
FIG. 4B is a schematic view illustrating change in a phase difference proportional to a frequency difference of the radio frequency current supplied to the radio frequency antennas of the respective systems over time according to the first example.
Figure 4C:
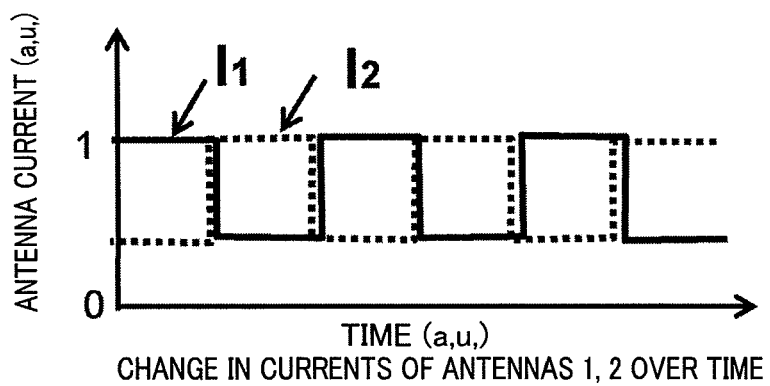
FIG. 4C is a schematic view illustrating change in the current value of the antenna current supplied to the radio frequency antennas of the respective systems over time according to the first example.

Referring to FIGS. 4A to 4C, an explanation will be made with respect to the method of operating the phase of the radio frequency current applied to the antennas, taking the two-system antennas as an example by means of the controller for periodically changing the phase difference or current value of the radio frequency current over time. In the example shown in FIG. 4A, the phase difference of the current applied to the two-system antennas is changed over time in the range from 0° to 180° or larger by the controller including the phase circuits 14 and 16, and the control unit 20. The aforementioned change over time is performed in at least one cycle within the processing period at least from several seconds to approximately several minutes. The frequency equal to or lower than 50 kHz at the maximum is appropriate in consideration of the frequency sufficiently low to allow follow-up of the plasma distribution change. If the plasma processing condition includes multiple steps, the aforementioned processing period is set as the one for the step with the shortest processing period. The plasma distribution change rate is limited by the ion speed as the low moving speed. In this case, the feature time taken for the change of the plasma distribution over time is simply estimated.

The ion speed upon the distribution change, which is called Bohm speed will be expressed by the following expression 2.

$$UB=\sqrt{(kTe/M)} \quad (2)$$

where k denotes Boltzmann constant (1.3807E-23 J/K), e denotes the electron charge (1.6022E-19 C), Te denotes the electron temperature (K), and M denotes the mass of ion (kg).

Assuming that the electron temperature is 5 eV (58000 K), the Bohm speed, that is, UB=3700 (m/s) is calculated using such ion type as chlorine with mass number 35 generally used in the etching process. Assuming that a feature distance L where the plasma distribution changes over time in the example is approximately 0.1 (m), the feature time T (T=L/UB) at which the ion moves to change the distribution may be estimated to be expressed by T=27 µs. Accordingly, the responsive frequency of 37 kHz (1/27µ) is obtained.

The frequency higher than the aforementioned frequency cannot allow the ion to follow up the distribution change. It is therefore necessary to control the phase of the current applied to the antennas or time modulation of the output for changing the plasma generation position over time to several tens kHz or lower. The responsive frequency that depends on the ion type (mass) becomes 55 kHz in the case of oxygen. Although the frequency also depends on the electron temperature, the limit value of the responsive frequency may be estimated to approximately 50 kHz. Basically, the waveform indicating the change over time has the sine wave. However, it may be arbitrarily shaped in the range which can be controlled by the matching circuit.

FIG. 4B represents the method of generating the phase difference over time in proportion to the frequency difference by the controller for periodically changing the phase difference or current value of the radio frequency current, which shifts frequency of the two-system radio frequency power source. In this case, it is appropriate to set the frequency difference to 50 kHz as maximum value or lower. Each of the two-system radio frequency power sources is controlled to have the same frequency to change the output frequency over time so that the phase difference varies over time.

FIG. 4C represents the method of changing the current value as the output of the respective systems over time through the controller for periodically changing the phase difference or current value of the radio frequency current over time. The current intensity represented by the current value applied to the antennas of the respective systems is changed over time while shifting the phase. The arbitrary waveform indicating change in the current value of the antenna, for example, the pulse waveform shown in the drawing is used for modulating the current intensity as the current value. This makes it possible to move the radio frequency absorption region just below the antenna as passage of time.

Referring to FIGS. 4A to 4C, the explanation has been made with respect to the two systems. However, n (n: integer equal to or larger than 3) systems, which are equal to or larger than 3 systems may also be employed to sequentially change the radio frequency absorption position over time by the controller for periodically changing the phase difference or current value of the radio frequency current over time, which shifts the timing to change the phase difference between the respective systems of the adjacent antennas over time by (360/n) °. The intensity of the antenna current in the case of the n systems equal to or larger than 3 systems may be controlled by shifting the timing for the change in the intensity modulation between the adjacent antennas over time by (360/n) °.

Figure 5:
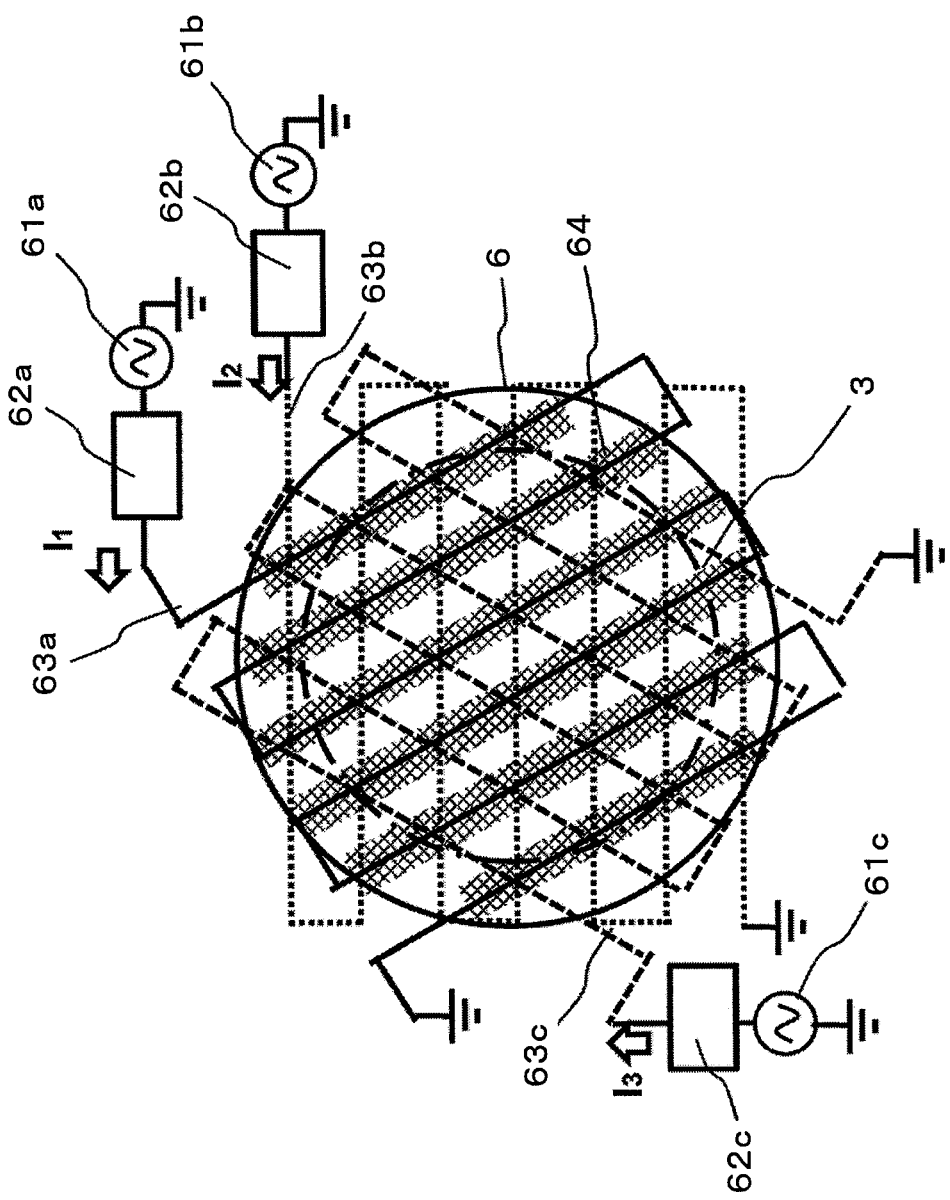
FIG. 5 is a schematic view illustrating a relationship between an exemplary configuration of the radio frequency antennas of the plasma processing device and the position where the plasma absorbs the radio-frequency power as a modification of the first example.

An explanation is made with respect to a modification of the first example of the plasma processing device of inductive coupling plasma type configured to employ 3-system (n-system) antennas. Referring to FIG. 5, the antenna shape and arrangement of the 3-system antenna will be described. As the drawing shows, the 3-system antennas 63a, 63b and 63c cross with one another at approximately 60° to form a triangle over the entire surface region of the wafer 3. Outputs of the radio frequency power sources 61a, 61b and 61c are supplied to the respective antennas via matching units 62a, 62b and 62c. As for the circuit structure of each terminal of the respective antennas, the circuit composed of the capacitor and coil (not shown) is provided between the ground part and the terminal of the antenna for adjustment of the voltage across the terminals of the antenna.

An explanation will be made (not shown in the drawing) with respect to time modulation of the current intensity of the radio-frequency power applied to the respective systems by controlling the respective radio frequency power sources, which is performed by the control unit 20 that constitutes the controller for periodically changing the phase difference or current value of the radio frequency current over time. For example, at the timing when the current $I_1$ output from the radio frequency power source 61a is maximized, the radio-frequency power is strongly absorbed in a radio frequency absorption region 64 as shown in the drawing to mainly generate the plasma. If the change in the current intensity over time proceeds at 120°, the plasma generation is intensified along the antenna 63b as the system of the radio frequency power source 61b. If the change in the current intensity over time further proceeds at 120°, the plasma generation will be intensified further along the antenna 63c. As described above, when modulating the current intensity, the plasma generation region moves as passage of time. As a result, the ion direction towards the wafer 3 is uniformly changed over time in the wafer plane in accordance with the change in the plasma density distribution over time. Generally, the approach to apply the radio-frequency power to the wafer has been used for draw-in of the ion from the plasma.

Figure 6:
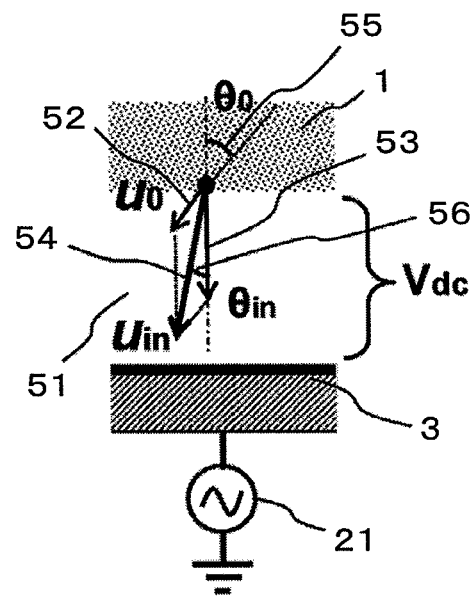
FIG. 6 is a schematic view illustrating a relationship between an incident angle of the ion incident on the wafer and an electric field in the sheath according to the first example.

Referring to FIG. 6, an incident angle of the radio-frequency power applied to the wafer in the above-described structure of the first example will be described. Upon application of the radio frequency output from the radio frequency power source 21 at 400 kHz to several tens MHz to the wafer 3 with power at several tens W to several kW, the electric field is generated in a sheath region 51 between the wafer 3 and the plasma 1. The ion with larger mass than the electron is accelerated mainly by the dc voltage component Vdc (V) of the electric field. The electric field in which the ion actually responds depends on radio-frequency power to be applied. The frequency at several hundreds kHz may respond to the electric field as the radio frequency component to some extent. When using the generally employed radio frequency power source at 13.56 MHz, the ion is accelerated by the dc voltage component Vdc (V).

The ion speed U accelerated at the potential Vdc in a direction 53 towards the wafer is expressed by the following expression 3.

$$U=\sqrt{(2eVdc/M)} \quad (3)$$

where e denotes the electron charge (1.6022E-19 C) and M denotes the ion mass.

When an incident angle 55 ($\theta_0$) of the ion incident on the sheath and an incident speed 52 ($U_0$) are given, an angle 56 ($\theta in$) formed upon incidence on the wafer 3 is expressed by the following expression 4.

$$\theta in=\tan^{-1}(U_0 \tan \theta_0/U) \quad (4)$$

As a result, the incident angle to the wafer is controlled to be uniform in accordance with the expression 4 by changing the incident angle 55 ($\theta_0$) to the sheath in the wafer plane over time.

Figure 7A:
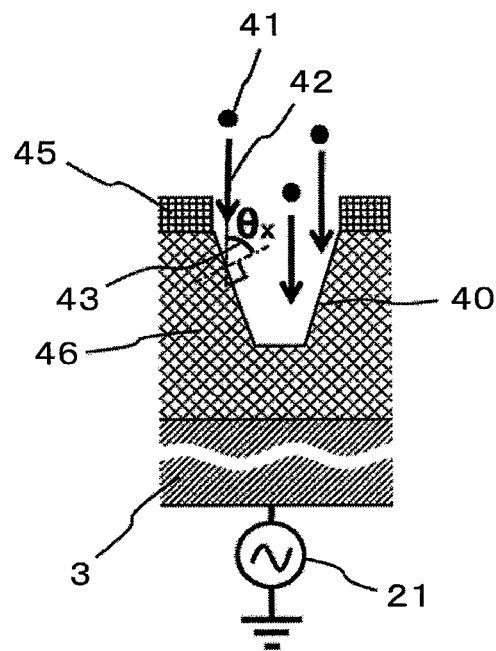
FIG. 7A is a view schematically illustrating a general case of the ion incident on the wafer at the uniform incident angle.
Figure 7B:
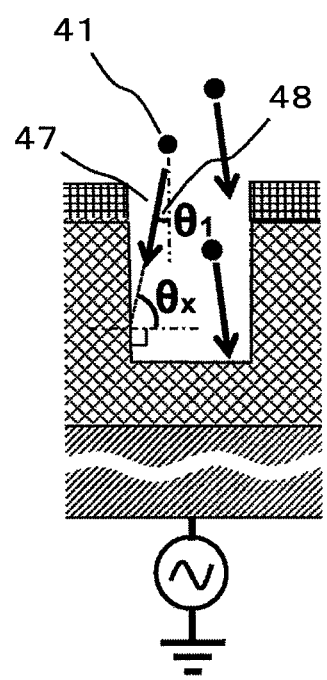
FIG. 7B is a view schematically illustrating the case of the ion in the incident direction that changes over time according to the first example.

The effect on the etching process resulting from change in the incident angle of the ion to the wafer over time will be described referring to FIGS. 7A and 7B. FIG. 7A schematically represents the case where a general ion 41 is incident on the wafer at a uniform incident angle. FIG. 7B schematically represents the case where the incident direction of the ion changes over time corresponding to the example. Referring to FIG. 7A, a film 43 for etching is subjected to the etching process while using a mask film 45 as a cover. The radio frequency radio-frequency power is applied to the wafer 3 with the radio frequency power source 21. The ion 41 is incident on the film 46 for etching at an ion speed 42 in the wafer direction in the radio frequency magnetic field so as to proceed the etching process. At this time, the direction of the ion speed 42 is substantially uniform in accordance with the wafer position. Accordingly, a side wall portion 40 in the etching region has a tapered shape because the sputter efficiency through the ion depends on the incident angle θx of the ion 41 on the side wall portion 40. Generally, as the incident angle θx approaches 90°, the sputter efficiency rapidly drops to proceed the etching in the tapered form.

Referring to FIG. 7B corresponding to the example, an incident angle 48 ($\theta_1$) of the ion 41 to the film for etching is changed to incline as passage of time. The incident angle θx to the side wall becomes smaller than 90° by the incident angle of $\theta_1$ even if the side wall makes substantially a right angle)(90°). This makes it possible to allow the etching to proceed to be substantially at a right angle.

The explanation has been made with respect to application of the plasma processing device according to the first example to the inductive coupling plasma etching apparatus. However, the present invention is not limited to the example. For instance, in the example, the plasma generation position is changed over time planarly by crossing the antennas. If the incident angle of the ion has the distribution only in the radial direction, the antennas are arranged only in the radial direction so that the plasma generation position is changed in the radial direction over time.

Second Example

Figure 8:
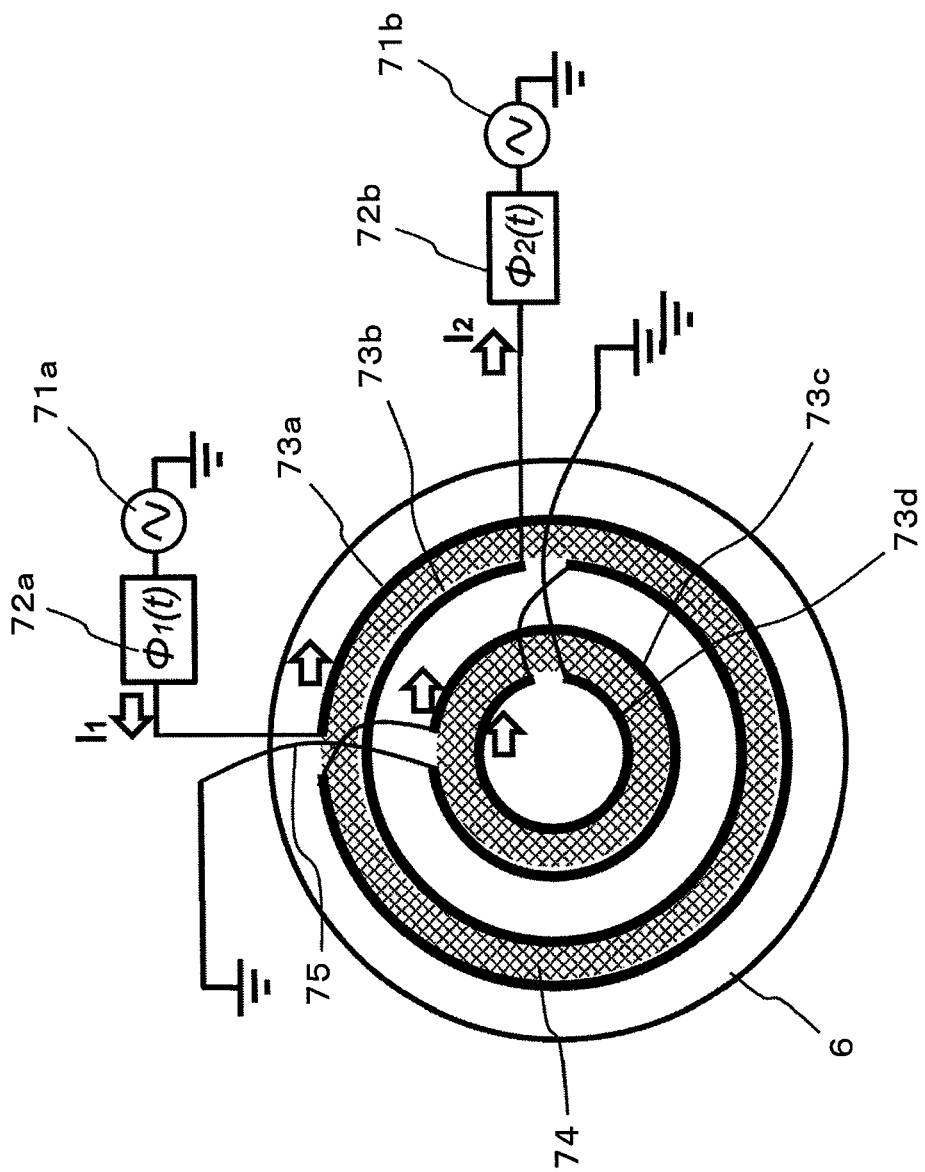
FIG. 8 is a schematic view illustrating a relationship between an exemplary configuration of the radio frequency antennas and the position where the plasma absorbs radio-frequency power according to a second example.

A second example of the plasma processing device is configured to dispose multiple antennas only in the radial direction. Referring to FIG. 8, four antennas 73a, 73b, 73c and 73d are provided concentrically at the position opposite the sample wafer at the center of the vacuum window 6. Two-system radio frequency power sources 71a and 71b are used for power supply to the respective antennas 73a, 73b, 73c and 73d so that the radio frequency current from the radio frequency power source 71a is controlled via a phase circuit 72a to apply the radio frequency current through connection from the antenna 73a to the antenna 73c. The radio frequency power source 71b controls the radio frequency current via a phase circuit 72b so as to apply the radio frequency current from the antenna 73b to the antenna 73d. According to the example, the antennas 73a and 73b, and the antennas 73c and 73d constitute the adjacent induction antennas, respectively. The controller for periodically changing the phase difference or current value of the radio frequency current over time serves to periodically change each phase difference of the radio frequency current of the adjacent induction antennas.

The terminals of the respective antennas are connected to earth through a wiring 75 via a not shown impedance circuit and the like. The impedance circuit is composed of a capacitor or an inductance, and ensures operation of the radio frequency potential at the terminals of the respective antennas 73. Each phase of the currents $I_1$ and $I_2$ of the respective antenna systems is controlled by the phase circuits 72a and 72b that constitute the controller for periodically changing the phase difference or current value of the radio frequency current over time. If the currents $I_1$ and $I_2$ have the phase of the flow in arrow directions shown in the drawing, the radio frequency power is strongly absorbed in the radio frequency absorption region 74 between the antennas of the respective systems. If the phase circuits 72a and 72b change the current phase from the arrow direction to cause the current phase difference of the system to reach 180°, the region where the radio frequency radio-frequency power is strongly absorbed is moved to the position just below the respective antennas 73. The configuration of the example allows the incident angle of the ion to be uniform in the radial direction of the sample wafer.

Third Example

An exemplary configuration of the electrode of the inductive coupling type plasma processing device as described above will be explained as a third example.

Figure 9:
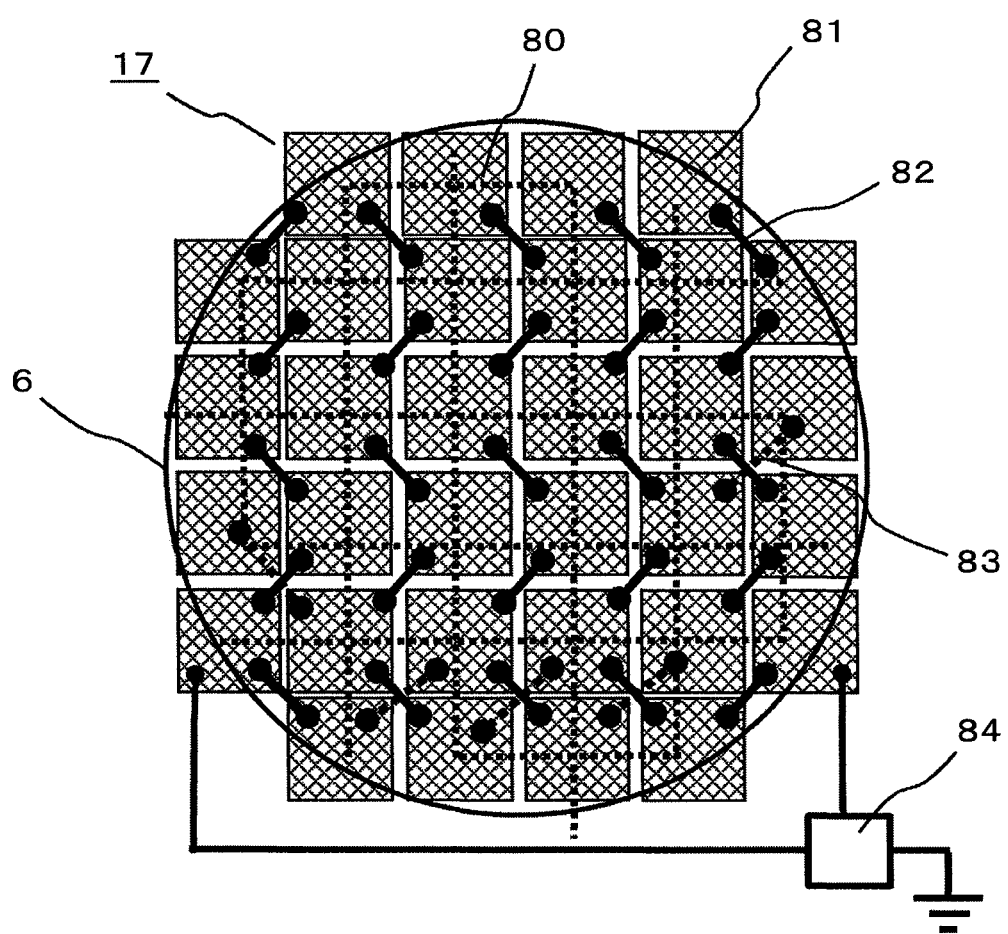
FIG. 9 is a schematic view illustrating an exemplary structure of an electrode used for the plasma processing device according to a third example.

FIG. 9 is a plan view schematically illustrating an exemplary configuration of the electrodes used for the plasma processing device according to the first example. Referring to the device shown in FIG. 1, use of an electrode 17 is intended to prevent unnecessary application of high voltage of the antenna 12 to the plasma through capacity coupling, and to remove the stain sticking to the vacuum window 6 for cleaning with ion sputter by controlling the radio frequency voltage of the radio frequency power source 18 connected to the electrode 17.

The electrode 17 shown in FIG. 9 allows compact conductor plates 81 in two-dimensional arrangement to cover the vacuum window 6 for the purpose of suppressing the eddy current induced by the radio frequency current flowing to the antennas. The conductor plates 81 are disposed along antenna conductors 80 so that the induced current flowing along the antenna conductor 80 is blocked by the gap between the conductor plates 81. The conductor plates 81 at the positions that intersect the direction of the antenna conductors 80 are linked through a wiring 82 and an intersection wiring 83 for wire connection to increase the inductance to the eddy current so as to be suppressed. With the impedance circuit or the radio frequency power source 84, each of the conductor plates 81 is allowed to ground the radio frequency induced by the conductor plate 81 via the impedance circuit, or to clean the vacuum window through application of the radio frequency by the radio frequency power source.

Fourth Example

Figure 10A:
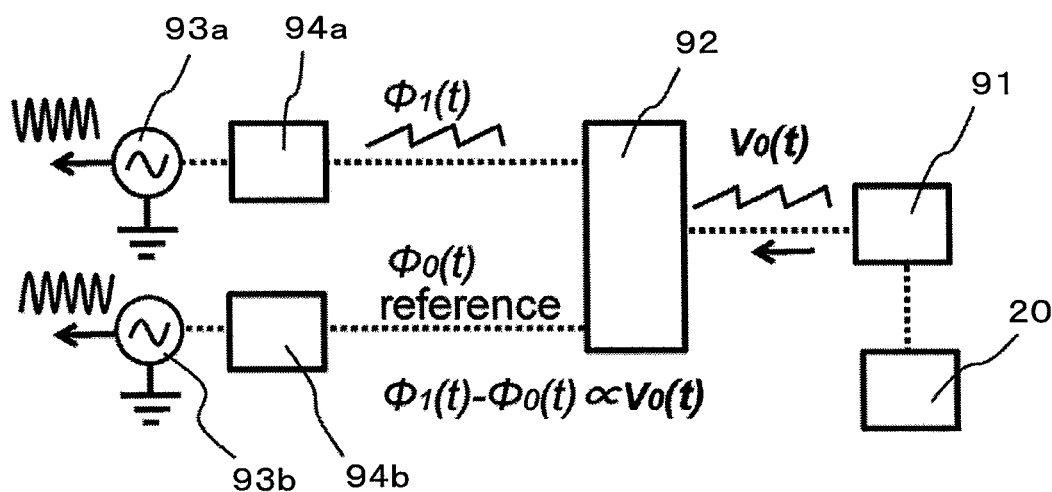
FIG. 10A is a schematic view illustrating an example of change in the phase difference of the radio frequency current supplied to the radio frequency antennas over time according to the respective examples.
Figure 10B:
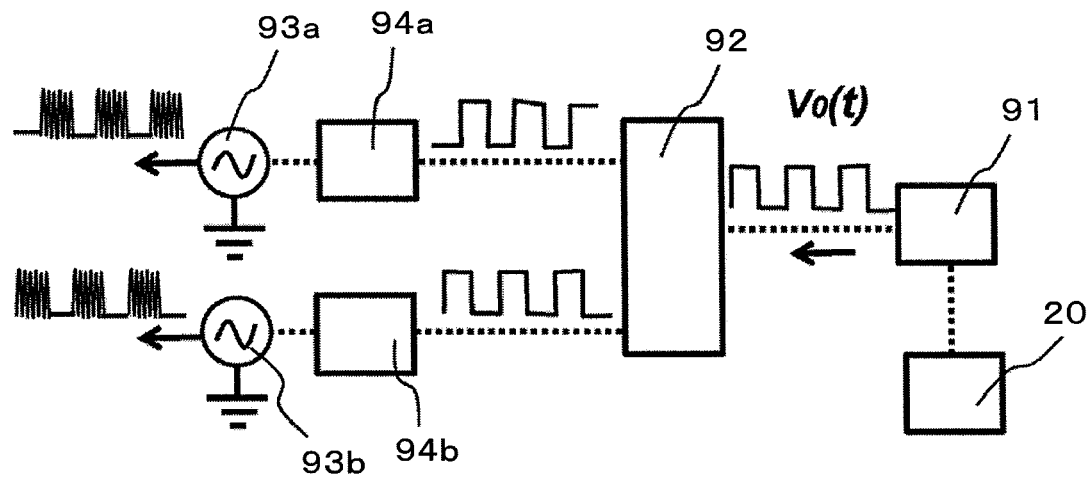
FIG. 10B is a schematic view illustrating an example of change in the current value of the radio frequency current supplied to the radio frequency antennas over time according to the respective examples.

A fourth example will be described with respect to an exemplary configuration of the controller for periodically changing the phase difference or current value of the radio frequency current over time, which is suitable for changing the phase difference or the output of the radio frequency power source of the plasma processing device of inductive coupling type. FIG. 10A illustrates an example of the controller for controlling the phase difference of the current between two-system power sources. FIG. 10B schematically illustrates an example of the controller for controlling the current value as the power source output.

Referring to FIG. 10A showing the controller for controlling the current phase difference, the control unit 20 for controlling overall the system operates a waveform transmitter 91 so as to generate a voltage waveform that changes over time V0(t) in accordance with the intended phase difference that changes over time, and input the resultant waveform in a phase shifter 92. The phase shifter 92 has a function that allows a power source control unit 94 to control the current phase of a radio frequency power source 93 in proportion to the voltage waveform V0(t) as the input signal. The current phase between the two systems may be changed over time in proportion to the voltage waveform V0(t) by changing the phase of a radio frequency power source 93*a* over time while keeping the phase of a radio frequency power source 93*b* constant as the reference phase. Besides the structure shown in FIG. 10A, the power source with the function of controlling the phase, which is provided in the main body of the radio frequency power source is available for the method of controlling the current phase. In such a case, the output of the waveform transmitter 91 is input in the respective radio frequency power source as the control signal to ensure change in the current phase of the respective systems over time.

Referring to FIG. 10B showing the controller for controlling the power source output, the phase shifter 92 allows a rectangular waveform from the waveform transmitter 91 to have the phase difference. The output of the phase shifter 92 is input as an input signal for operating the output of the power source control unit 94. The phase difference of the rectangular signal is operated by the phase shifter 92 to allow the change over time so that the radio frequency power sources between the respective systems output alternately. The waveform of the waveform transmitter 91 may have not only the rectangular wave but also triangular wave, pulse wave, and sine wave. The aforementioned approach makes it possible to change the intensity and phase difference of the current flowing to the antennas of the respective systems over time.

With respect to the above-described examples, preferably the change in the current output or the phase of the radio frequency to be supplied to the respective systems of the induction antennas over time periodically changes the phase difference or the current intensity in a range from 1 cycle to the frequency of 50 kHz or lower. It is possible to provide the frequency of the radio frequency power sources of the respective systems with the frequency difference equal to or lower than 1 MHz for the purpose of time modulating the current phase of the radio frequency power sources of the respective systems. Furthermore, it is preferable to set the distance between the dielectric window opposite the sample and the sample to be shorter than the diameter thereof for the uniform ion incident angle.

The plasma processing device according to the invention as described in detail is configured to change the phase difference between currents flowing to the radio frequency antennas of multiple systems or the current value sequentially over time, and to sweep the radio frequency absorption region to the plasma. This ensures to make the ion incident angle to the wafer uniform through the time average over the entire surface of the sample.

The invention is not limited to the examples as described above, and may include various modifications. The examples have been described in detail for better understanding of the invention, and are not necessarily restricted to the one provided with all the structures of the description. The structure of any one of the examples may be partially replaced with that of the other example. Alternatively, it is possible to add the structure of any one of the examples to that of the other example. It is also possible to have the part of the structure of the respective examples added to, removed from and replaced with the other structure.

What is claimed is:

1. A plasma processing apparatus comprising:
   a processing chamber for plasma processing of a sample;
   a dielectric window for air-tightly sealing the processing chamber;
   two induction antennas provided outside the dielectric window for generating an induced magnetic field;
   two radio frequency power sources for supplying radio frequency power to the induction antennas; and
   a controller configured to periodically change a phase difference of a radio frequency current flowing to the induction antennas over time,
   wherein a first of the two induction antennas comprises a first plurality of U-shaped elements which receives radio frequency power from a first radio frequency power source, a first of said first plurality of U-shaped elements comprising first and second element portions extending in a first direction and connected at respective first ends to a third element portion which extends in a second direction orthogonal to said first direction, and a second of said first plurality of U-shaped elements comprising first and second element portions extending in said second direction and connected at respective first ends to a third element portion which extends in the first direction,
   wherein a second of the two induction antennas comprises a second plurality of U shaped elements which receives radio frequency power from a second radio frequency power source, a first of said second plurality of U-shaped elements comprising first and second element portions extending in the second direction and connected at respective first ends to a third element portion which extends in the first direction, and a second of said first plurality of U-shaped elements comprising first and second element portions extending in said first direction and connected at respective first ends to a third element portion which extends in the second direction,
   wherein the first plurality of induction antennas is arranged to have a first fold of a predetermined length in the first direction, and a second fold of a predetermined length in the second direction, and the second plurality of induction antennas is arranged to have a first fold of a predetermined length in the second direction, and a second fold of a predetermined length in the first direction, the two induction antennas being arranged such that the first and second pluralities of induction antennas cross with each other at right angles, and are adjacent and parallel to each other,
   wherein a second end of said second element of said first plurality of U-shaped elements, and a second end of said second element of said second plurality of U-shaped elements, are connected only via an intermediate wiring connection, and
   wherein all elements of said first induction antenna are connected only in series, and all elements of said second induction antenna are connected only in series.

2. The plasma processing apparatus according to claim 1, wherein the dielectric window is provided with an electrode at a side where the induction antennas are disposed for suppressing an eddy current induced by the radio frequency current flowing to the induction antennas.

3. The plasma processing apparatus according to claim 2, wherein the electrode includes a plurality of conductor plates which are two-dimensionally arranged along the induction antennas.

4. The plasma processing apparatus according to claim 1, wherein the first phase difference is 0° and the second phase difference is 180°.

5. The plasma processing apparatus according to claim 1, wherein the controller is configured to change the phase difference of the radio frequency current flowing to the adjacent induction antennas to a value between 0 and 360 degrees.

6. A processing apparatus comprising:
a plasma processing chamber for plasma processing of a sample;
a dielectric window for air-tightly sealing the processing chamber;
a plurality of induction antennas provided outside the dielectric window for generating an induced magnetic field;
a plurality of radio frequency power sources for supplying radio frequency power to the induction antennas; and
a controller configured to periodically change a phase difference of a radio frequency current flowing to any two adjacent induction antennas of said plurality of induction antennas over time so that a magnetic field intensifies at a first absorption region when the respective radio frequency power sources for each said two adjacent induction antennas have a first phase difference, and intensifies at second absorption regions and is cancelled at the first absorption region when the respective radio frequency power sources for each said two adjacent induction antennas have a second phase difference,
wherein a first of the plurality of induction antennas comprises a first plurality of U-shaped elements which receives radio frequency power from a first of said plurality of radio frequency power sources, a first of said first plurality of U-shaped elements comprising first and second element portions extending in a first direction and connected at respective ends to a third element portion which extends in a second direction orthogonal to said first direction, and a second of said first plurality of U-shaped elements comprising first and second element portions extending in said second direction and connected at respective ends to a third element portion which extends in the first direction,
wherein a second of the plurality of induction antennas comprises a second plurality of U-shaped elements which receives radio frequency power from a second of said plurality of radio frequency power sources, a first of said second plurality of U-shaped elements comprising first and second element portions extending in the second direction and connected at respective ends to a third element portion which extends in the first direction, and a second of said first plurality of U-shaped elements comprising first and second element portions extending in said first direction and connected at respective ends to a third element portion which extends in the second direction, and
wherein in the case where the number of the induction antennas is n as an integer equal to or larger than 3, the induction antennas are arranged so as to cross with one another at an acute angle forming an n-polygonal shape,
wherein the controller shifts a timing to change the phase difference of the radio frequency current flowing to adjacent induction antennas over time by (360/n) degrees, and
wherein all elements of each of said plurality of induction antennas are connected only in series.

7. The plasma processing apparatus according to claim 6, wherein a circuit composed of a capacitor and a coil is provided between a ground part and a terminal of each of the plurality of induction antennas.

8. The plasma processing apparatus according to claim 6, wherein the first phase difference is 0° and the second phase difference is 180°.

9. The plasma processing apparatus according to claim 6, wherein the controller is configured to change the phase difference of the radio frequency current flowing to the adjacent induction antennas to a value between 0 and 360 degrees.

10. A plasma processing apparatus comprising:
a processing chamber for plasma processing of a sample;
a dielectric window for air-tightly sealing the processing chamber;
two induction antennas provided outside the dielectric window for generating an induced magnetic field;
two radio frequency power sources for supplying radio frequency power to the induction antennas; and
a controller configured to apply a time modulated radio frequency current to the induction antennas, and to make phases of the time modulated radio frequency currents to be different from one another to periodically change a phase difference of the radio frequency current flowing to the induction antennas,
wherein a first of the two induction antennas comprises a first plurality of U-shaped elements which receives radio frequency power from a first radio frequency power source, a first of said first plurality of U-shaped elements comprising first and second element portions extending in a first direction and connected at first respective ends to a third element portion which extends in a second direction orthogonal to said first direction, and a second of said first plurality of U-shaped elements comprising first and second element portions extending in said second direction and connected at respective first ends to a third element portion which extends in the first direction,
wherein the first plurality of induction antennas is arranged to have a first fold of a predetermined length in the first direction, and a second fold of a predetermined length in the second direction, and the second plurality of induction antennas is arranged to have a first fold of a predetermined length in the second direction, and a second fold of a predetermined length in the first direction, said first and second pluralities of U-shaped elements being arranged to respectively cross with each other at right angles, and being arranged adjacent and parallel to each other,
wherein a second end of said second element of said first plurality of U-shaped elements, and a second end of said second element of said second plurality of U-shaped elements, are connected only via an intermediate wiring connection, and
wherein all elements of said first induction antenna are connected only in series, and all elements of said second induction antenna are connected only in series.

11. The plasma processing apparatus according to claim 10, wherein the dielectric window is provided with an electrode at a side where the induction antennas are disposed for suppressing an eddy current induced by the radio frequency current flowing to the induction antennas.

12. The plasma processing apparatus according to claim 11, wherein the electrode includes a plurality of conductor plates which are two-dimensionally arranged along the induction antennas.

13. The plasma processing apparatus according to claim 10,
   wherein the dielectric window is positioned opposite the sample, and
   wherein a distance between the dielectric window and the sample is shorter than a diameter of the sample to be processed in the processing chamber.

14. The plasma processing apparatus according to claim 10, wherein the first phase difference is 0° and the second phase difference is 180°.

15. The plasma processing apparatus according to claim 10, wherein the controller is configured to change the phase difference of the radio frequency current flowing to the adjacent induction antennas to a value between 0 and 360 degrees.

* * * * *